United States Patent [19]

Yamaguchi

[11] Patent Number: 4,853,896
[45] Date of Patent: Aug. 1, 1989

[54] WRITE DRIVER CIRCUIT OF SEMICONDUCTOR MEMORY DEVICE

[75] Inventor: Takashi Yamaguchi, Tokyo, Japan

[73] Assignee: NEC Corporation, Tokyo, Japan

[21] Appl. No.: 60,146

[22] Filed: Jun. 10, 1987

[30] Foreign Application Priority Data

Jun. 10, 1986 [JP] Japan .................. 61-135304

[51] Int. Cl.[4] ................. G11C 7/00; G11C 11/40
[52] U.S. Cl. ............... 365/189.02; 365/230.03; 365/230.06; 365/189.08
[58] Field of Search ................ 365/230, 189

[56] References Cited

U.S. PATENT DOCUMENTS

| | | | |
|---|---|---|---|
| 3,980,899 | 9/1976 | Shimada et al. | 365/230 |
| 4,542,486 | 9/1985 | Anami et al. | 365/230 |
| 4,569,036 | 2/1986 | Fujii et al. | 365/230 |

*Primary Examiner*—Stuart N. Hecker
*Assistant Examiner*—Alyssa H. Bowler
*Attorney, Agent, or Firm*—Sughrue, Mion, Zinn, Macpeak & Seas

[57] ABSTRACT

A write driver circuit of a semiconductor memory device having a read/write memory cell array including a plurality of read/write cell blocks each having an input terminal, comprising driver input terminals including a first driver input terminal at which a first driver input signal is to appear and a second driver input terminal at which a second driver input signal is to appear, each of the first and second driver input signals being shiftable between discrete first and second voltage levels, and a plurality of driver circuit sections each having input terminals at the first and second drive input terminals, respectively, and an output terminal connected to the input terminal of each of the read/write cell blocks, respectively. Each of the driver circuit sections is operative to activate the associated one of the read/write cell blocks in the copresence of the first and second driver input signals of the first voltage levels at the first and second driver input terminals, respectively.

8 Claims, 3 Drawing Sheets

WRITE DRIVER CIRCUIT OF SEMICONDUCTOR MEMORY DEVICE

FIELD OF THE INVENTION

The present invention relates to a semiconductor memory device of the type having a read/write memory cell array such as typically a random access type memory cell array consisting of a plurality of read/write cell blocks and, more particularly, to a write driver circuit for use in such a semiconductor memory device.

DESCRIPTION OF THE PRIOR ART

FIG. 1 of the drawings shows an example of a prior-art write driver circuit for a semiconductor memory device to which the present invention generally pertains.

As shown, there is provided a data input terminal 10 at which a data input signal $D_{IN}$ is to appear and swing between predetermined low and high voltage levels during operation of the memory device. The supplied data input signal $D_{IN}$ is passed through a buffer circuit 12 composed of a series combination of four inverters $I_1$, $I_2$, $I_3$ and $I_4$ and is fed to a write driver circuit 14. The write driver circuit 14 has two input terminals which consist of a first input terminal 16 at which a driver input signal $D_{in}$ resulting from the original data input signal $D_{IN}$ is to appear and a second input terminal 18 at which an active-high write enable signal WE is to appear.

The write driver circuit 14 includes a two-input NAND gate 20 having one of its input terminals connected to the first input terminal 16 of the driver circuit 14, the other input terminal being connected to the second driver input terminal 18. The output terminal of the NAND gate 20 is connected to the gate of a p-channel first field-effect transistor 22 which has its source terminal connected to a voltage supply line of a voltage $V_{CC}$ of high-level as shown. The write driver circuit 14 further includes a two-input NOR gate 26 which has one of its input terminals also connected to the first input terminal 16 of the driver circuit 14, the other input terminal being connected to the second input terminal 18 of the driver circuit 14 through an inverter 24. The output terminal of the NOR gate 26 is connected to the gate of an n-channel second field-effect transistor 28 which has its source terminal connected to a ground or low-level voltage supply line. The first and second field-effect transistors 22 and 28 have their respective drains commonly connected through a driver output terminal 30 to a common bus line WB.

The common bus line WB in turn is connected through a common node 32 to branch bus lines $WB_1$ and $WB_2$ across resistances 34a and 34b, respectively. The memory cell array of the memory device under consideration is assumed to consist of two read/write cell blocks 36a and 36b having respective input terminals 38a and 38b. The input terminal 38a of one read-write cell block 36a is connected at one end to the bit lines (not shown) of the read/write cell block 36a and at the other to the common node 32 through the branch bus line $WB_1$ and across the resistance 34a. Likewise, the input terminal 38b of the other read/write cell block 36b is connected at one end to the bit lines (not shown) of the read/write cell block 36a and at the other to the common node 32 through the branch bus line $WB_2$ and across the resistance 34b. As will be seen from FIG. 1, the common bus line WB leading from the driver output terminal 30 is implemented by a horizontal wiring strip extending from the terminal 30 to the common node 32 over length $L_1$. On the other hand, the branch bus lines $WB_1$ and $WB_2$ leading to the read/write cell blocks 36a and 36b, respectively, are implemented by vertical strip portions extending over lengths $L_2$ and $L_2$, respectively, from the common node 32 and horizontal wiring strip portions extending each over a length $L_3$ from the vertical wiring strip portions to the input terminals 38a and 38b of the read/write cell blocks 36a and 36b, respectively.

The memory device herein shown further includes a decoder/multiplexer circuit 39 which is to receive address signals. The address signals thus supplied to the decoder/ multiplexer circuit 39 are decoded and steered to a selected one of the two read/write cell blocks 36a and 36b to select one of the memory cells in the selected read/write cell block 36a or 36b.

The semiconductor memory device having the write driver circuit 14 and read/write cell blocks 36a and 36b thus arranged is fabricated on a semiconductor integrated circuit chip together with other circuit components of the device. The common bus line WB and branch bus lines $WB_1$ and $WB_2$ intervening between the output terminal 30 of the write driver circuit 14 and the read/write cell blocks 36a and 36b is implemented by wiring strips formed on the integrated circuit chip. Preferred as the conductor for such wiring strips is aluminum for its low resistance but, actually, aluminum could not be used for the wiring strips. It is required to use polysilicon or any conductive material other than aluminum for the bus lines WB, $WB_1$ and $WB_2$. This is because of the fact that aluminum is used for the wiring strips for the supply voltage and ground lines for the memory device. Polysilicon is however extremely higher in resistance than aluminum, ordinarily exhibiting a resistance which is even a hundred times higher than that of aluminum as well known in the art. The resistances 34a and 34b shown intervening between the write driver circuit 14 and the read/write cell blocks 36a and 36b are those parasitic to the wiring strips of polysilicon.

Description will be hereinafter made in regard to the mode of operation of the prior-art write driver circuit 14.

As shown in FIG. 2, it is assumed that the data input signal $D_{IN}$ appearing at the data input terminal 10 rises to high voltage level at time $t_1$ in the presence of the write enable signal WE at the second input terminal 18 of the driver circuit 14. After some delay time provided by the buffer circuit 12, the driver input signal $D_{in}$ at the first input terminal 16 of the driver circuit 14 rises to high voltage level as at time $t_2$ subsequent to time $t_1$. With the driver input signal $D_{in}$ thus swung to high voltage level at time $t_2$ in the presence of the write enable signal WE of high voltage level, there appears a signal of low voltage level at the output terminal of the NAND gate 20 so that the p-channel first field-effect transistor 22 is turned on. The write enable signal WE of high voltage level is inverted by the inverter 24 so that at time $t_2$ a signal of high voltage level appears at the output terminal of the NOR gate 26 and maintains the n-channel second field-effect transistor 28 in a non-conduction state. The p-channel first field-effect transistor 22 being turned on with the n-channel second field-effect transistor 28 thus turned off, there appears the supply voltage $V_{CC}$ of high level at the output terminal 30 of the write driver circuit 14 with the result that the voltage at the common bus line WB rises to high voltage level as at time $t_3$ immediately subsequent to time $t_2$, as shown in FIG. 2. The high-level voltage thus appearing at the output terminal 30 of the driver circuit 14 is passed through the common node 32 and branch bus line $WB_1$ to one read/write cell block 36a and through the common node 32 and branch bus line $WB_2$ to the other read/write cell block 36b. As will be seen from FIG. 2, the voltage on each of these branch bus lines $WB_1$ and $WB_2$ rises at a rate considerably lower than the rate of increase of the voltage at the common bus line WB.

When the p-channel first field-effect transistor 22 is turned off and the n-channel second field-effect transistor 28 turned on with the supplied data input signal $D_{IN}$ swung to low voltage level, the voltage at the output terminal 30 of the write driver circuit 14 shifts to low voltage level. In this instance, the voltage on each of the branch bus lines $WB_1$ and $WB_2$ declines at a rate which is also lower than the rate of decrease of the voltage at the terminal 30.

The rate of change of the voltage at each of the bus lines $WB_1$ and $WB_2$ depends on the time constant expressed in the form of the product of each of the parasitic resistances 34a and 34b multiplied by the sum of the capacitance of each bit line (not shown) of each of the read/write cell blocks 36a and 36b and the capacitance of the wiring strip forming each of the bus lines $WB_1$ and $WB_2$. As has been noted, the wiring strips implementing the bus lines WB, $WB_1$ and $WB_2$ leading from the write driver circuit 14 to the read/write cell blocks 36a and 36b are formed typically of polysilicon. In this instance, each of the parasitic resistances 34a and 34b of such wiring strips is approximately of the order of 1 kilo-ohm, while the capacitance of each bit line of each of the read-write cell blocks 36a and 36b is approximately 5 picofarads and the capacitance of the wiring strip forming each of the bus lines $WB_1$ and $WB_2$ is also of the order of 5 picofarads. With the total capacitance of 10 picofarads involved in conjunction with each read/write cell block, the time constant effective for each of the read/write cell blocks 36a and 36b is of the order of as large as 10 nanoseconds. Such a large time constant significantly limits the rate of change of the voltage on each of the branch bus $WB_1$ and $WB_2$ and results in irregularities in the speeds at which data is to be written into the memory cells of each of the read/write cell blocks 36a and 36b of the device. The present invention contemplates elimination of such a drawback of a prior-art write driver circuit of the described nature.

SUMMARY OF THE INVENTION

In accordance with one important aspect of the present invention, there is provided a write driver circuit of a semiconductor memory device having a read/write memory cell array such as typically a random access type memory cell array including a plurality of read/write cell blocks each having an input terminal, comprising (a) driver input terminals including a first driver input terminal at which a first driver input signal is to appear and a second driver input terminal at which a second driver input signal is to appear, each of the first and second driver input signals being shiftable between discrete first and second voltage levels, and (b) a plurality of driver circuit sections each having input terminals at the first and second driver input terminals, respectively, and an output terminal connected to the input terminal of each of the read/write cell blocks, respectively, (c) each of the driver circuit sections being operative to activate the associated one of the read/write cell blocks in the copresence of the first and second driver input signals of the first voltage levels at the first and second driver input terminals, respectively.

The driver input terminals of the write driver circuit thus constructed and arranged may further include third and fourth driver input terminals at which third and fourth driver input signals complementary to each other and each shiftable substantially between the first and second voltage levels, each of the driver circuit sections being operative to activate the associated one of the read/write cell blocks in the copresence of the first, second and third driver input signals of the first voltage levels at the first, second and third driver input terminals, respectively, and the fourth driver input signal of the second voltage levels at the fourth driver input terminal.

In accordance with another important aspect of the present invention, there is provided a write driver circuit of a semiconductor memory device having a read/write memory cell array including a plurality of read/write cell blocks each having an input terminal, comprising (a) driver input terminals including a first driver input terminal to which a data input signal is to be applied and a second driver input terminal to which a write control signal is to be applied, and (b) a plurality of driver circuit sections each for receiving the data input signal and the write control signal from the first and second driver input terminals, respectively, (c) each of the driver circuit sections having an output terminal connected to the input terminal of each of the read/write cell blocks, respectively, (d) each of the driver circuit sections being located in the vicinity of the associated one of the read/write cell blocks and being operative to apply a write data corresponding to the data input signal to the associated one of the read/write cell blocks when the write control signal takes an active level.

BRIEF DESCRIPTION OF THE DRAWINGS

The features and advantages of a write driver circuit according to the present invention will be more clearly appreciated from the following description taken in conjunction with the accompanying drawings in which like reference numerals designate similar or corresponding circuit components and signals and in which.

DESCRIPTION OF THE PREFERRED EMBODIMENTS

Description will be hereinafter made with reference to FIGS. 3 to 5 of the drawings which show preferred embodiments of a write driver circuit according to the present invention.

Figure 3:
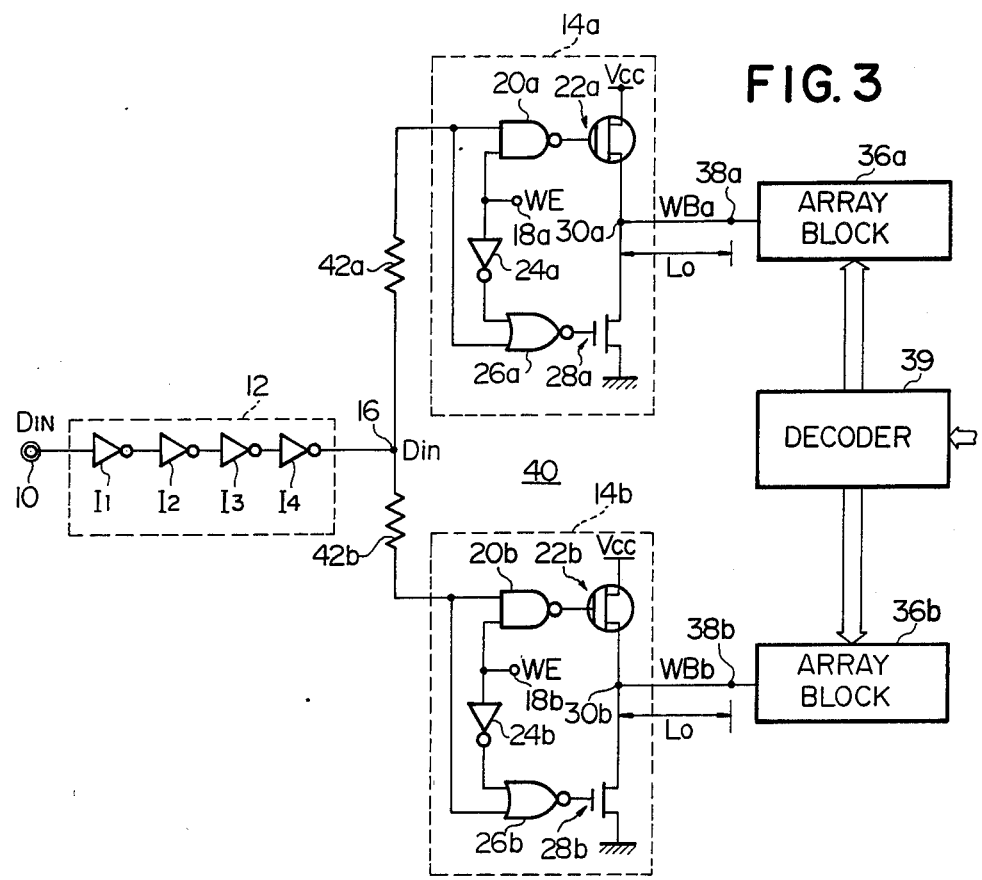
FIG. 3 is a circuit diagram showing the arrangement of a preferred embodiment of a write driver circuit according to the present invention.

Referring first to FIG. 3, the semiconductor memory device incorporating a write driver circuit embodying the present invention is also assumed to have a memory cell array consisting of two, first and second read/write cell blocks 36a and 36b having respective input terminals 38a and 38b as shown. Though not shown, the input terminal 38a of the read/write cell block 36a is connected at one end to the bit lines of the read/write cell block 36a and, likewise, the input terminal 38b of the read/write cell block 36b is connected at one end to the bit lines of the read/write cell block 36b. As well known in the art, each of these first and second read/write cell blocks 36a and 36b is composed of a multiplicity of memory cells arranged in rows and columns. As in the arrangement described with reference to FIG. 1, the write driver circuit, herein represented in its entirety by numeral 40, is connected to a data input terminal 10 through a buffer circuit 12 composed of a series combination of four inverters $I_1$, $I_2$, $I_3$ and $I_4$. At the data input terminal 10 is to appear a data input signal $D_{IN}$ which swings between predetermined low and high voltage levels during operation of the memory device. The data input signal $D_{IN}$ carries pieces of information to be written into selected one of the read/write cell blocks 36a and 36b. There is also provided a decoder/mulitiplexer circuit 39 which decodes and steers supplied address signals to a selected one of the two read/write cell blocks 36a and 36b to select one of the memory cells in the selected read/write cell block 36a or 36b.

The write driver circuit 40 embodying the present invention largely consists of two, first and second driver circuit sections 14a and 14b which are provided in conjunction with the first and second read/write cell blocks 36a and 36b, respectively. The write driver circuit 40 composed of such two circuit sections 14a and 14b also has two driver input terminals which consist of a first driver input terminal 16 at which a driver input signal $D_{in}$ resulting from the original data input signal $D_{IN}$ is to appear and a second driver input terminal 18a, 18b at which an active-high write enable signal WE is to appear.

Figure 1:
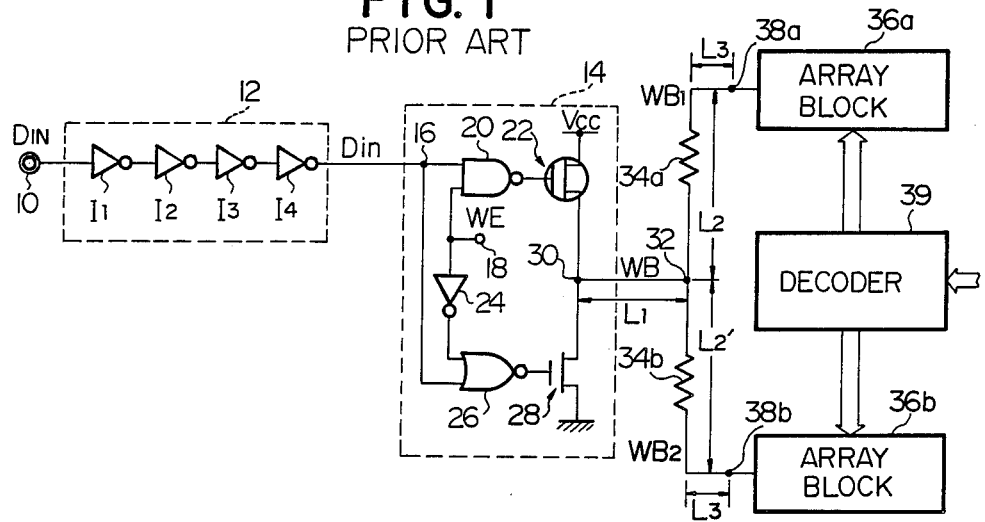
FIG. 1 is a circuit diagram showing the arrangement of a prior-art write driver circuit for a semiconductor memory device having a read/write memory cell array such as a random access memory cell array consisting of two read/write cell blocks.
Figure 2:
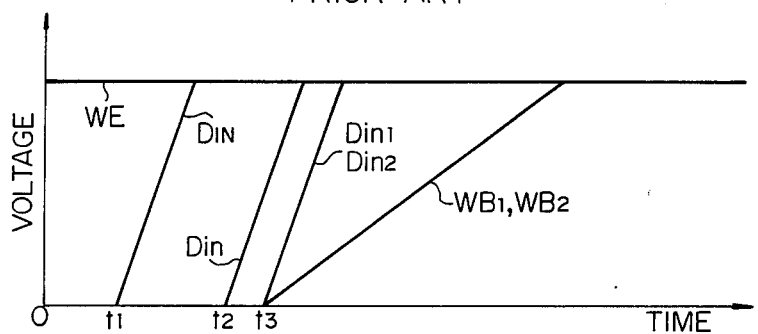
FIG. 2 is a time chart showing the operation of the prior-art driver circuit shown in FIG. 1.

Each of the two circuit sections 14a and 14b of the write driver circuit 40 is per se similar in construction and arrangement to the prior-art write driver circuit 14 described with reference to FIG. 1. Thus, the first driver circuit section 14a comprises a two-input NAND gate 20a, a p-channel first field-effect transistor 22a, an inverter 24a, a two-input NOR gate 26a and an n-channel second field-effect transistor 28a and, likewise, the second driver circuit section 14b comprises a two-input NAND gate 20b, a p-channel first field-effect transistor 22b, an inverter 24b, a two-input NOR gate 26b and an n-channel second field-effect transistor 28b. Each of the NAND gates 20a and 20b has one of its input terminals connected to the first driver input terminal 16 of the driver circuit 40, the other input terminals of gates 20a and 20b being connected to the second driver input terminals 18a, 18b, respectively. The output terminals of the NAND gates 20a and 20b are connected to the gates of the p-channel first field-effect transistors 22a and 22b, respectively, each of which has its source terminal connected to a voltage supply line of a voltage $V_{CC}$ of high-level as shown. Each of the NOR gates 26a and 26b has one of its input terminals also connected to the first driver input terminal 16 of the driver circuit 14, the other input terminals of gates 26a, 26b being connected to the second driver input terminals 18a, 18b of the driver circuit 14 through inverters 24a, 24b, respectively. The output terminals of the NOR gates 26a and 26b are connected to the gates of the n-channel second field-effect transistor 28a and 28b each of which has its source terminal connected to a ground or low-level voltage supply line. The first and second field-effect transistors 22a and 28a of the first driver circuit section 14a have their respective drains commonly connected through a driver output terminal 30a to a bus line $WB_a$. Similarly, the first and second field-effect transistors 22b and 28b of the second driver circuit section 14b have their respective drains commonly connected through a driver output terminal 30b to a bus line $WB_b$. The bus lines $WB_a$ and $WB_b$ in turn are connected to the input terminals 38a and 38b of the first and second read/write cell blocks 36a and 36b, respectively. As will be seen from FIG. 3, each of the bus lines $WB_a$ and $WB_b$ leading from the driver output terminals 30a and 30b to the read/write cell blocks 36a and 36b, respectively, is implemented simply by a horizontal wiring strip extending over length $L_o$ from each of the terminals 30a and 30b to each of the respective input terminals 38a and 38b of the read/write cell blocks 36a and 36b. The wiring strips thus implementing the bus lines $WB_a$ and $WB_b$ of are typically implemented by wiring strips of polysilicon on a semiconductor integrated circuit chip. As will be seen from comparison between FIGS. 1 and 3, the length $L_o$ of the wiring strip forming each of the bus lines $WB_a$ and $WB_b$ of the circuit arrangement herein shown is largely equal to the sum of the lengths $L_1$ and $L_3$ of the wiring strips forming part of the bus lines WB, $WB_1$ and $WB_2$ in the prior-art circuit arrangement shown in FIG. 1.

Indicated at 42a in FIG. 3 is a parasitic resistance which is in effect on a wiring strip leading from the first driver input terminal 16 to the first driver circuit section 14a and at 42b is a parasitic resistance which is in effect on a wiring strip leading from the driver input terminal 16 to the second driver circuit section 14b. Due to these parasitic resistances 42a and 42b, the signal $D_{in}$ appearing at the first driver input terminal 16 is input as signals $D_{in1}$ and $D_{in2}$ with reduced voltage levels to the driver circuit sections 14a and 14b, respectively.

Figure 4:
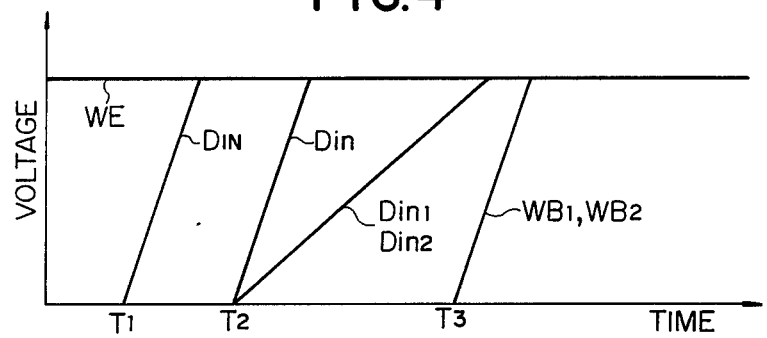
FIG. 4 is a time chart showing the operation of the prior-art driver circuit shown in FIG. 3.

In operation, the data input signal $D_{IN}$ appearing at the data input terminal 10 may rise to high voltage level at time $T_1$ as shown in FIG. 4 in the presence of the write enable signal WE at the second driver input terminal 18a, 18b of each of the write driver circuit 40. After some delay time provided by the buffer circuit 12, the driver input signal $D_{in}$ at the first driver input terminal 16 of the driver circuit 40 rises to high voltage level as at time $T_2$ with a consequent rise in the voltage level of each of the signals $D_{in1}$ and $D_{in2}$ input to the driver circuit sections 14a and 14b, respectively. As will be seen from FIG. 4, the voltage of each of these signals $D_{in1}$ and $D_{in2}$ rises at a rate considerably lower than the rate of increase of the voltage level of the signal $D_{in}$ at the driver input terminal 16. The rate of change of the voltage level of the signals $D_{in1}$ and $D_{in2}$ depends on the time constant expressed in the form of the product of each of the parasitic resistances 42a and 42b multiplied by each of the capacitances of the wiring strips forming the input lines to the driver circuit sections 14a and 14b.

With the driver input signal $D_{in}$ swung to high voltage level at time $T_2$ in the presence of the write enable signal WE of high voltage level, there appears a signal of low voltage level at the output terminal of each of the NAND gates 20a and 20b so that the p-channel first field-effect transistors 22a and 22b of the circuit sections 14a and 14b are turned on. The write enable signal WE of high voltage level is inverted by the inverters 24a and 24b so that at time $T_2$ a signal of high voltage level appears at the output terminal of each of the NOR gates 26a and 26b and maintains each of the n-channel second field-effect transistors 28a and 28b of the circuit sections 14a and 14b in a non-conduction state. The p-channel first field-effect transistors 22a and 22b being turned on with the n-channel second field-effect transistors 28a and 28b thus turned off, there appears the supply voltage $V_{CC}$ of high level at the output terminal 30a of the first driver circuit section 14a and at the output terminal 30b of the second driver circuit section 14b. It therefore follows that the voltage at the bus line $WB_a$ leading to the input terminal 38a of the first read/write cell block 36a and the voltage at the bus line $WB_b$ leading to the input terminal 38b of the second read/write cell block 36b rise to high voltage levels as at time $T_3$ immediately subsequent to time $T_2$, as shown in FIG. 4. The high-level voltage thus appearing at the output terminal 30a of the first driver circuit section 14a is passed through the bus line $WB_a$ to the input terminal 38a of the first read/ write cell block 36a and, likewise, the high-level voltage appearing at the output terminal 30b of the second driver circuit section 14b is passed through the bus line $WB_b$ to the input terminal 38b of the second read/write cell block 36b.

With the driver circuit 40 thus constructed and arranged in accordance with the present invention, the resistance parasitic to each of these bus lines $WB_a$ and $WB_b$ has been found to be approximately of the order of as small as 100 ohms or even less. The parasitis resistance of this order is less than ten per cent of the parasitic resistance effective between the driver circuit and each of the associated read/ write cell blocks as in the prior-art arrangement described with reference to FIG. 1. The wiring strips implementing the bus lines $WB_a$ and $WB_b$ being assumed to be formed of polysilicon, the capacitance of the wiring strip forming each of the bus lines $WB_a$ and $WB_b$ is of the order of 2.5 picofarads, which is equal to one half of the approximately 5 picofarads in the case of the prior-art arrangement described with reference to FIG. 1. In view of the capacitance of approximately 5 picofarads of each bit line of each read/write cell block, the total capacitance of approximately 7.5 picofarads is involved in conjunction with each of the read/write cell blocks 36a and 36b. This means that the time constant effective for each of the read/write cell blocks 36a and 36b is of the order of 0.75 nanoseconds, which is sufficiently smaller than the time constant of 10 nanoseconds in the case of the prior-art arrangement described with reference to FIG. 1. Such a small time constant contributes to increasing the rate of change of the voltage on each of the bus lines $WB_a$ and $WB_b$ and results in significant reduction in the irregularities in the speeds at which data is to be written into the memory cells of each of the read/write cell blocks 36a and 36b of the device.

Figure 5:
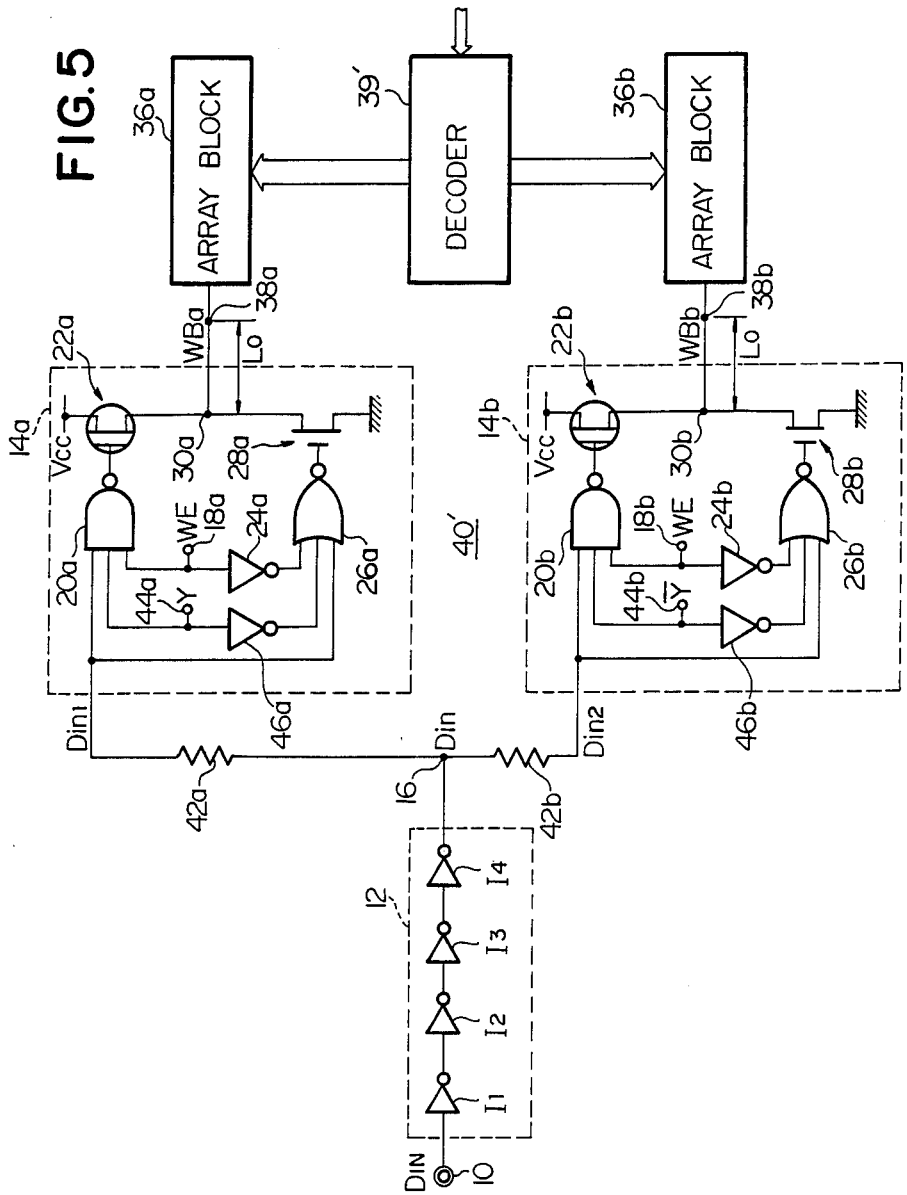
FIG. 5 is a diagram similar to FIG. 3 but shows another preferred embodiment of a write driver circuit according to the present invention.

FIG. 5 shows another preferred embodiment of a write driver circuit according to the present invention. The write driver circuit, now designated in its entirety by 40', is a modification of the circuit 40 described with reference to FIG. 3 and thus also consists of two, first and second circuit sections 14a and 14b. The memory device herein shown further includes a decoder/multiplexer circuit 39' which is to receive address signals. The address signals thus supplied to the decoder/multiplexer circuit 39' are decoded and passed to each of the two read/write cell blocks 36a and 36b to select one of the memory cells in each of the read/write cell blocks 36a and 36b.

Each of the first and second driver circuit sections 14a and 14b is similar to its counterpart of the circuit 40 except in that each circuit section is responsive not only to the data input signal $D_{IN}$ and write enable signal WE but also to active-high first and second block enable signals Y and $\overline{Y}$. These first and second block enable signals Y and $\overline{Y}$ are complementary to each other and are effective to enable selected one of the read/write cell blocks 36a and 36b when shifted to high voltage levels. Thus, the write driver circuit 40' shown in FIG. 5 has a third driver input terminal 44a at which the first block enable signal Y is to appear and a fourth driver input terminal 44b at which the second block enable signal $\overline{Y}$ is to appear.

Each of the NAND gates 20a and 20b of the driver circuit 40' is of the three-input design. The NAND gate 20a of the first driver circuit section 14a has a third input terminal connected to the third driver input terminal 44a for the block enable signal Y. The NAND gate 20b of the second driver circuit section 14b has a third input terminal connected to the fourth driver input terminal 44b for the block enable signal $\overline{Y}$. Each of the NOR gates 26a and 26b of the driver circuit 40' is also of the three-input design. The NOR gate 26a of the first driver circuit section 14a has a third input terminal connected to the third driver input terminal 44a for the block enable signal Y through an inverter 46a. The NOR gate 26b of the second driver circuit section 14b has a third input terminal connected to the fourth driver input terminal 44b for the block enable signal $\overline{Y}$ through an inverter 46b.

Thus, the NAND gate 20a of the first driver circuit section 14a is conditioned to produce an output signal of low voltage level only in the copresence of the driver input signal $D_{in}$ of high voltage level at the first driver input terminal 16, the write enable signal WE of high voltage level at the second driver input terminal 18 and the first block enable signal Y of high voltage level at the third driver input terminal 44a. The NAND gate 20b of the second driver circuit section 14b is conditioned to produce an output signal of low voltage level only in the copresence of the driver input signal $D_{in}$ of high voltage level at the first driver input terminal 16, the write enable signal WE of high voltage level at the second driver input terminal 18 and the second block enable signal $\overline{Y}$ of high voltage level at the fourth driver input terminal 44b. On the other hand, the NOR gate 26a of the first driver circuit section 14a is conditioned to produce an output signal of high voltage level only in the copresence of the driver input signal $D_{in}$ of low voltage level at the first driver input terminal 16, the write enable signal WE of high voltage level at the second driver input terminal 18 and the first block enable signal Y of high voltage level at the third driver input terminal 44a. The NOR gate 26b of the second driver circuit section 14b is conditioned to produce an output signal of high voltage level only in the copresence of the driver input signal $D_{in}$ of low voltage level at the first driver input terminal 16, the write enable signal WE of high voltage level at the second driver input terminal 18 and the second block enable signal $\overline{Y}$ of high voltage level at the fourth driver input terminal 44b.

When the first block enable signal Y is at high voltage level with the second block enable signal $\overline{Y}$ maintained at low voltage level in the presence of the signals of high levels at the first and second driver input terminals 16 and 18, the NAND gate 20a of the first driver circuit section 14a is conditioned to produce an output signal of low voltage level so that the p-channel first field-effect transistor 22a of the circuit section 14a is turned on and the NAND gate 20b of the second driver circuit section 14b is conditioned to produce an output signal of high voltage level so that the p-channel first field-effect transistor 22b of the circuit section 14b is turned off. Under these conditions, a signal with a voltage level approximating the high-level supply voltage $V_{CC}$ appears at the input terminal 38a of the first read/write cell block 36a while a signal with a voltage level approximating the ground potential appears at the input terminal 38b of the second read/write cell block 36b. Only the first read/write cell block 36a is thus activated in the presence of the first block enable signal Y of high voltage level. In like manners only the second read/write cell block 36b is activated in the presence of the first block enable signal Y of low voltage level. The driver circuit 40' of the embodiment shown in FIG. 5 is, in this fashion, useful for reducing the power dissipation of the memory device since one of the two read/write cell blocks 36a and 36b is maintained de-activated when the other of the read/write cell blocks is in use.

What is claimed is:

1. A write driver circuit of a semiconductor memory device having a read/write memory cell array including a plurality of read/write cell blocks each having an input terminal, comprising
    (a) driver input terminals including a first driver input terminal at which a first driver input signal is to appear and a second driver input terminal at which a second driver input signal is to appear, each of the first and second driver input signals being shiftable between discrete first and second voltage levels, said driver input terminals further including third and fourth driver input terminals at which third and fourth driver input signals complementary to each other and each shiftable substantially between said first and second voltage levels are respectively applied and
    (b) a plurality of driver circuit sections each having input terminals at said first and second driver input terminals, respectively, and an output terminal connected to the input terminal of a different one of said read/write cell blocks,
    (c) each of said driver circuit sections being operative to activate its associated one of said read/write cell blocks in the copresence of said first, second and third driver input signals of said first voltage level at said first, second and third driver input terminals, respectively, and said fourth driver input signal of said second voltage level at said fourth driver input terminal.

2. A write driver circuit as set forth in claim 1, in which said first driver input signal is a data input signal carrying information to be written into a selected one of said read/write cell blocks and said second driver input signal is a write enable signal enabling storage of information into said read/write cell blocks.

3. A write driver circuit as set forth in claim 1, in which said first driver input signal is a data input signal carrying information to be written into a selected one of said read/write cell blocks, said second driver input signal is a write enable signal enabling storage of information into said read/write cell blocks, said third driver input terminal of its associated one of said read/write of a selected one of said read/write cell blocks, and said fourth driver input signal is a block enable signal disabling activation of a selected one of said read/write cell blocks.

4. A write driver circuit as set forth in claim 1, in which each of said driver circuit sections comprises first and second switch means connected in parallel to the input terminal of the associated one of said read/write cell blocks, and first and second logic means respectively connected to said first and second switch means, said first logic means being operative to activate said first switch means in the copresence of said first and second driver input signals each of said first voltage levels at said first and second driver input terminals, respectively, and said second logic means being operative to activate said second switch means in the copresence of said first driver input signal of said second voltage level at said first driver input terminal and said second driver input signal of said first voltage level at said second driver input terminal.

5. A write driver circuit as set forth in claim 1, in which each of said driver circuit sections comprises first and second switch means connected in parallel to the input terminal of its associated one of said read/write cell blocks, and first and second logic means respectively connected to said first and second switch means, said first logic means being operative to activate said first switch means in the copresence of said first, second and third driver input signals each of said first voltage level at said first, second and third driver input terminals, respectively, and said fourth driver input signal of said second voltage levels at said fourth driver input terminal, and said second logic means being operative to activate said second switch means in the copresence of said first and fourth driver input signals each of said second voltage level at said first and fourth driver input terminals, respectively, and said second and third driver input signals each of said first voltage level at said second and third driver input terminals, respectively.

6. A write driver circuit of a semiconductor memory device having a read/write memory cell array including a plurality of read/write cell blocks each having an input terminal, comprising
    (a) driver input terminals including a first driver input terminal at which a data input signal carrying information to be written into a selected one of said read/write cell blocks is to appear and a second driver input terminal at which a write enable signal enabling storage of information into said read/write cell blocks is to appear, each of the data input signal and write enable signal being shiftable between discrete first and second voltage levels, and
    (b) a plurality of driver circuit sections each having input terminals at said first and second driver input terminals, respectively, each of said driver circuit sections comprising
        a logic NAND gate having a first input terminal connected to said first driver input terminal and a second input terminal connected to said second driver input terminal, a first transistor having a control terminal connected to the output terminal of said NAND gate, an input terminal connected to a source of a first supply voltage and an output terminal connected to the input terminal of each of said read/write cell blocks, respectively, a logic NOR gate having a first input terminal connected to said first driver input terminal and a second input terminal connected to said second driver input terminal through a logic inverter, and a second transistor having a control terminal connected to the output terminal of said NOR gate, an input terminal connected to a source of a second supply voltage and an output terminal connected to the input terminal of each of said read/write cell blocks, respectively.

7. A write driver circuit of a semiconductor memory device having a read/write memory cell array including a plurality of read/write cell blocks each having an input terminal, comprising (a) driver input terminals including a first driver input terminal at which a data input signal carrying information to be written into a selected one of said read/write cell blocks is to appear, a second driver input terminal at which a write enable signal enabling storage of information into said read/write cell blocks is to appear, a third driver input terminal at which a first block enable signal enabling activation of a selected one of said read/write cell blocks is to appear and a fourth driver input terminal at which a second block enable signal disabling activation of a selected one of said read/write cell blocks is to appear, each of the data input signal and write enable signal being shiftable between discrete first and second voltage levels, and (b) a plurality of driver circuit sections each having input terminals at said first and second driver input terminals, respectively, said driver circuit sections including at least two driver circuit sections, one of the two driver circuit sections comprising a logic NAND gate having a first input terminal connected to said first driver input terminal, a second input terminal connected to said second driver input terminal, and a third input terminal connected to said third driver input terminal, a first transistor having a control terminal connected to the output terminal of said NAND gate, an input terminal connected to a source of a first supply voltage and an output terminal connected to the input terminal of each of said read/write cell blocks, respectively, a logic NOR gate having a first input terminal connected to said first driver input terminal, a second input terminal connected to said second driver input terminal through a logic inverter, and a third input terminal connected to said third driver input terminal through a logic inverter, and a second transistor having a control terminal connected to the output terminal of said NOR gate, an input terminal connected to a source of a second supply voltage and an output terminal connected to the input terminal of each of said read/write cell blocks, respectively, the other of said two driver circuit sections comprising a logic NAND gate having a first input terminal connected to said first driver input terminal, a second input terminal connected to said second driver input terminal, and a third input terminal connected to said fourth driver input terminal, a first transistor having a control terminal connected to the output terminal of said NAND gate, an input terminal connected to a source of a first supply voltage and an output terminal connected to the input terminal of each of said read/write cell blocks, respectively, a logic NOR gate having a first input terminal connected to said first driver input terminal, a second input terminal connected to said second driver input terminal through a logic inverter, and a third input terminal connected to said fourth driver input terminal through a logic inverter, and a second transistor having a control terminal connected to the output terminal of said NOR gate, an input terminal connected to a source of a second supply voltage and an output terminal output terminal connected to the input terminal of each of said read/write cell blocks, respectively.

8. A write driver circuit of a semiconductor memory device having a read/write memory cell array including a plurality of read/write cell blocks each having an input terminal, comprising (a) driver input terminals including a first driver input terminal to which a data input signal is to be applied and a second driver input terminal to which a write control signal is to be applied, said driver input terminals further including third and fourth driver input terminals to which third and fourth driver input signals complementary to each other and each shiftable substantially between first and second voltage levels are respectively applied and (b) a plurality of driver circuit sections each for receiving said data input signal and said write control signal from said first and second driver input terminals, respectively, (c) each of said driver circuit sections having an output terminal connected to the input terminal of a different one of said read/write blocks, (d) each of said driver circuit sections being located in a vicinity of an associated one of said read/write cell blocks and being operative to apply a write data corresponding to said data input signal to the associated one of said read/write cell blocks when said write control signal takes an active level, said second and third driver input signals each takes the first voltage level, and said fourth driver input signal takes the second voltage level.

* * * * *

UNITED STATES PATENT AND TRADEMARK OFFICE
CERTIFICATE OF CORRECTION

PATENT NO. : 4,853,896
DATED : Aug. 1, 1989
INVENTOR(S) : Takashi Yamaguchi

It is certified that error appears in the above-identified patent and that said Letters Patent is hereby corrected as shown below:

Column 2, line 7, delete "and $L_2$," and insert --and $L_2'$,--.

Signed and Sealed this

Ninth Day of October, 1990

Attest:

HARRY F. MANBECK, JR.

Attesting Officer

Commissioner of Patents and Trademarks